United States Patent [19]

Lum

[11] Patent Number: 5,309,328
[45] Date of Patent: May 3, 1994

[54] HANDSFREE FOREARM STRAP FOR PORTABLE EQUIPMENT

[76] Inventor: James C. P. Lum, 3304 Thorngate Dr., Herndon, Va. 22071

[21] Appl. No.: 960,686

[22] Filed: Oct. 14, 1992

[51] Int. Cl.[5] .................. H05K 7/02; A45C 3/14; A45F 5/00
[52] U.S. Cl. ...................... 361/809; 2/170; 224/219; 224/220; 224/222; 224/267
[58] Field of Search ............ 2/170, 158, 159, 160, 2/161 A, 162; 224/219, 220, 221, 222, 223, 267; 361/419, 420

[56] References Cited

U.S. PATENT DOCUMENTS

| | | |
|---|---|---|
| 1,613,664 | 1/1927 | Lewandowski . |
| 2,854,132 | 9/1958 | Bjerknes et al. . |
| 3,402,808 | 9/1968 | Yannuzzi . |
| 4,220,302 | 9/1980 | Hampton et al. . |
| 4,365,354 | 12/1982 | Sullivan . |
| 4,445,233 | 5/1984 | Rubin . |
| 4,819,846 | 4/1989 | Hannemann . |
| 4,834,274 | 5/1989 | Johnson . |
| 4,845,650 | 7/1989 | Meade et al. . |
| 4,961,235 | 10/1990 | Willinger . |
| 5,064,109 | 11/1991 | Caster ................. 224/267 |
| 5,154,506 | 10/1992 | Leard ................. 362/103 |
| 5,221,031 | 6/1993 | Prigmore ............. 224/267 |

Primary Examiner—Leo P. Picard
Assistant Examiner—Bot Ledynh
Attorney, Agent, or Firm—Cornelius J. Husar

[57] ABSTRACT

The disclosure relates to a forearm support strap for supporting various types of portable electronic equipment or instruments. The forearm support strap includes three exposed pile areas which will receive various types of equipment that has been provided with a mating Velcro loop strip on its base. A plurality of quick-release buckles are included to provide secure attachment to the user's forearm. A battery compartment is also included to provide electrical current to the attached instrument. Significant advantages of the forearm support strap include its ease of attachment, comfortable anti-rotation features and its availability to right-handed as well as left-handed users. Through the use of the forearm strap the user has both hands free to perform other tasks.

11 Claims, 2 Drawing Sheets

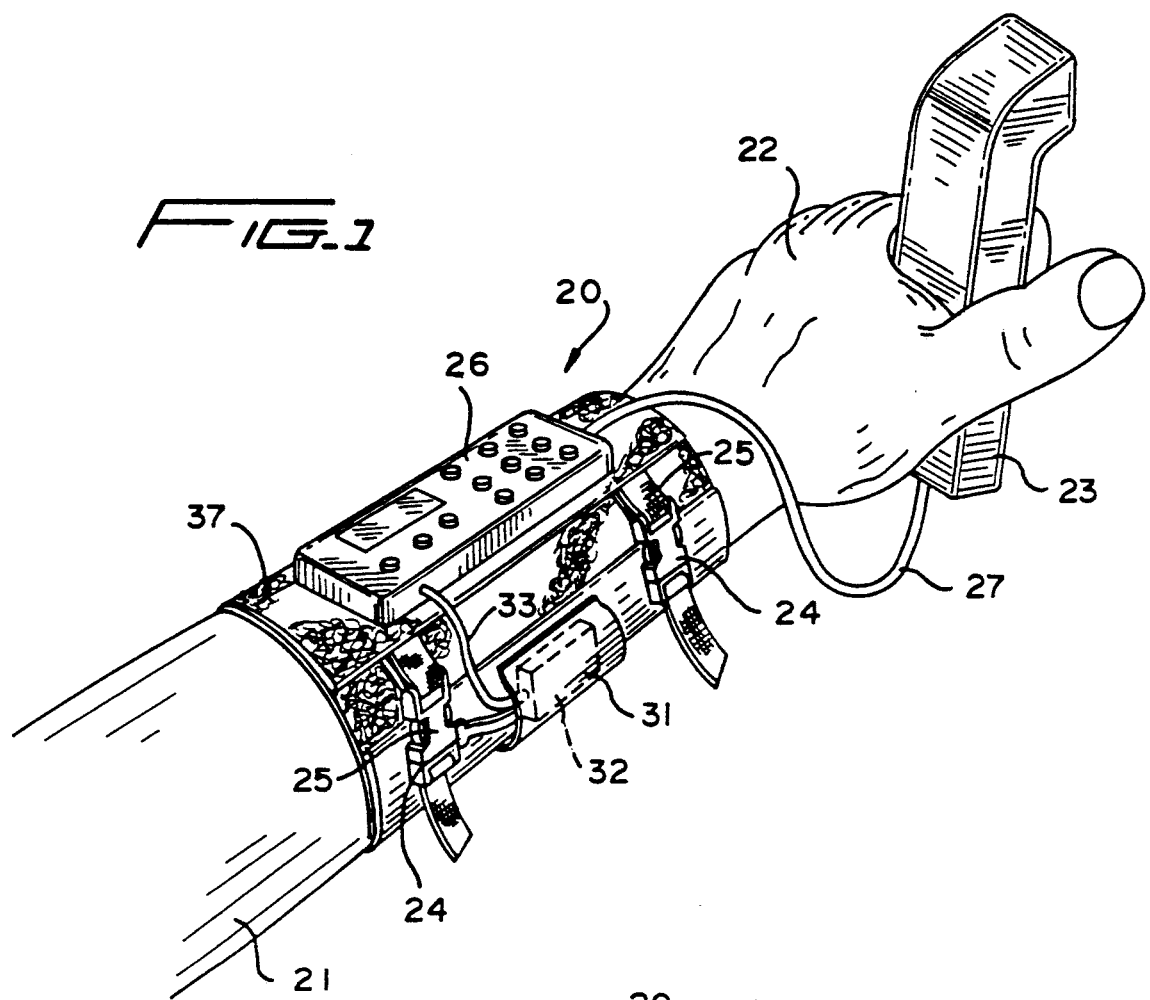
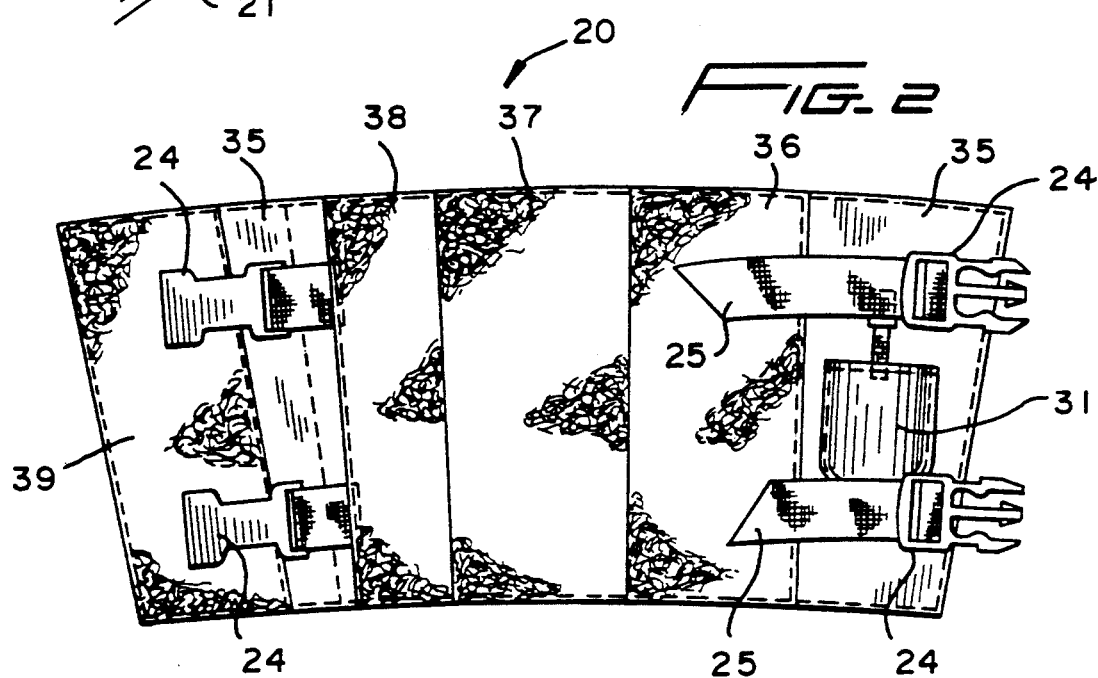

HANDSFREE FOREARM STRAP FOR PORTABLE EQUIPMENT

BACKGROUND OF THE INVENTION

Today, with the explosion of electronic technology, more and more types of portable equipment are becoming available. Although many of these types of portable equipment are small enough to be held in one hand, they are not normally easily accessible for use since they usually require the use of at least one hand, leaving the user with the one remaining hand, thus placing severe limitations on his/her capabilities to function properly in using this equipment. In order to make these types of equipment more accessible for use, applicant has designed a versatile handsfree forearm strap which allows portable equipment to be carried about and available for convenient use without the use of one's hands for holding the equipment.

There are presently various types of "gloves" which attempt to solve the aforementioned problems. However, these known "gloves" are provided with a cutaway hand portion to free the fingers of the user. These "gloves" come in left and right configurations to accommodate left and right-handed persons and also to enable the user to read the instrument and make entries, if necessary. Since the glove extends into the hand portion, the same "glove" could not be used by two persons of opposite hand. Therefore a plurality of gloves are required to accommodate left and right-handed users.

SUMMARY OF THE INVENTION

In view of the above noted need for a device permitting hands free use of portable equipment applicant has developed the instant invention. Applicant's novel forearm strap permits the freeing of both hands while serving as a carrier for one or more components such as a micro-computer, electrical testing equipment, or other electronic instruments.

Applicant's forearm strap is designed to conform to the user's forearm and takes into consideration the gradual increase in diameter thereof. Further, it is provided with primary and secondary attachment means for securing it to the user's forearm. A battery packet is included to provide electric current to the instrument in use.

The upper surface of the forearm strap is provided with Velcro attachment means allowing a electronic component which is provided with Velcro on its base to be securely attached thereto thus relieving the user's hand to perform other tasks.

Applicant's novel forearm strap extends from the wrist upward on the user's forearm approximately five inches toward the elbow allowing its use by either a right-handed or left-handed user.

OBJECTS OF THE INVENTION

An object of the invention is to provide a novel forearm strap for holding portable equipment thus freeing the user's hand.

Another object of the invention is to provide a novel forearm strap which can be used by both left-handed and right-handed persons.

A further object of the invention is to provide a forearm strap which includes primary and secondary securing attachment means and prevents rotation of the portable equipment relative to the user's forearm after a period of extended use.

Another object of the invention is to provide a forearm strap for portable equipment which generally conforms to the user's forearm and is comfortable to wear.

Yet another object of the invention is to provide a forearm strap for portable equipment which includes multiple pockets including a battery packet and closure therefore.

These and other objects of the invention will become more apparent hereinafter. The instant invention will now be described with particular reference to the accompanying drawings which form a part of this specification wherein like reference characters designate the corresponding parts in the several views.

BRIEF DESCRIPTION OF THE INVENTION

FIG. 1 is a perspective view illustrating the handsfree forearm strap attached to a person's forearm with a mini-computer mounted thereon.

FIG. 2 is a front plan view illustrating the novel forearm strap in its laid open position.

DETAILED DESCRIPTION OF THE DRAWINGS

Figure 3:
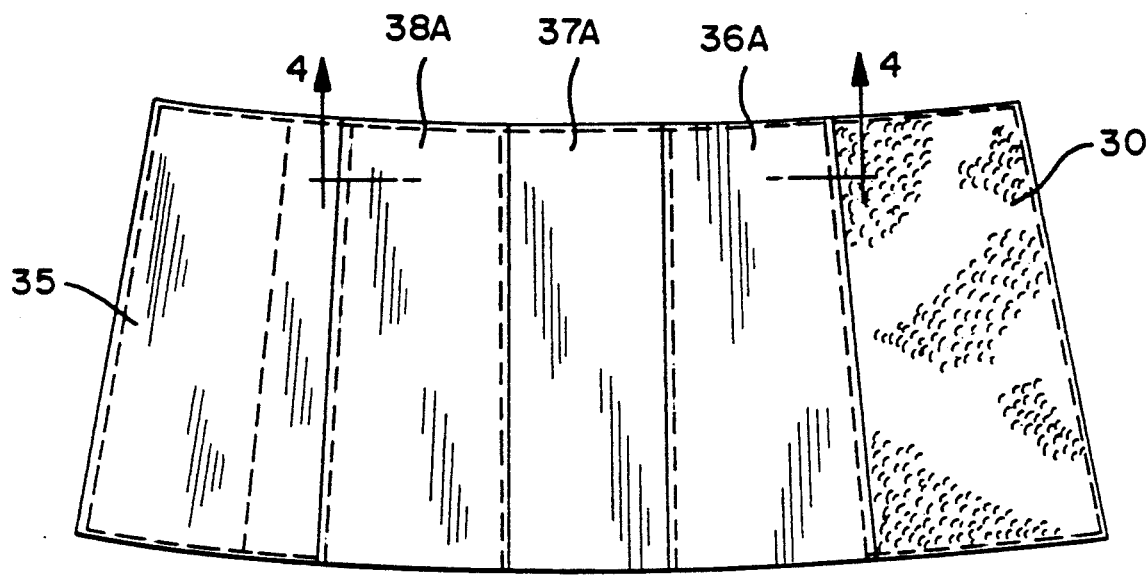
FIG. 3 is an illustration similar to FIG. 2 showing a rear view thereof.

Referring now to FIG. 1, there is a perspective illustration of the novel handsfree forearm strap, indicated by reference numeral 20, mounted on the user's forearm 21. As illustrated, the user's hand 22 is free to hold a bar code scanner 23 or any other desired type of portable equipment.

As shown, forearm strap 20 has been wrapped around the user's forearm 21 and initially held in place by mating Velcro portions (not visible in this view) and further secured by mating of quick-release buckles 24. After buckles 24 have been properly mated, further tightening is accomplished by pulling on each of nylon straps 25 to securely position forearm strap 20 on the user's forearm 21.

After positioning and securing forearm strap 20 to one's forearm 21, the micro-computer 26, which includes a strip of Velcro material securely fastened to its bottom surface, is securely attached to forearm strip 20 by its placement on pile strip 37. As shown, a nine volt battery 32 has been inserted into pocket 31 and secured therein. A pig tail 33 provides electrical current to micro-computer 26. Bar code reader 23 is interconnected with micro-computer 26 by means of lead 27 and supplies information to micro-computer 26 for storage when in use.

Although forearm strap 20 is shown on the left forearm 21, it can be used as well on the right forearm of a user. Thus only one forearm strap 20 is required to satisfy the needs of left-handed and right-handed users. Further, the forearm strap 20 can accommodate forearms of different sizes by varying the amount of overlap and the degree of tightening of straps 25.

Figure 4:
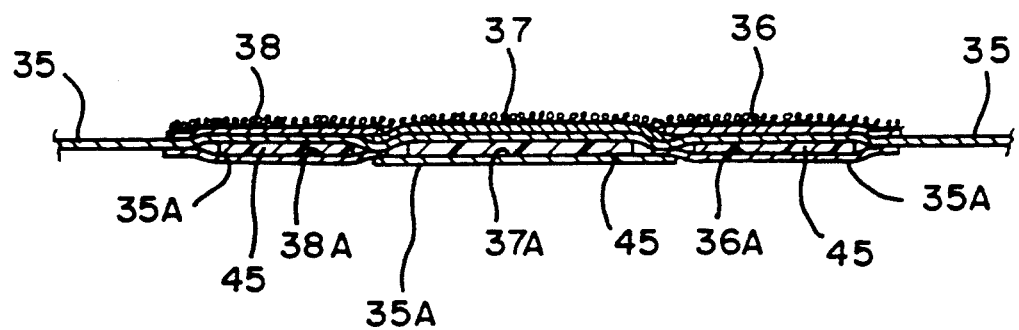
FIG. 4 is a sectional view taken along the plane 4—4 in FIG. 2 illustrating the attachment sections and the stiffening members therein.

Turning now to FIG. 2, there is shown a plan view of forearm strap 20. The main body 35 which consists of a single layer of nylon which has a high coefficient of friction material on its inner surface to prevent rotation when mounted on a user's forearm. Although only the exposed portions of main body 35 are shown, it is to be understood that main body 35 is one continuous piece which extends from one end to the opposite end. Secured to main body 35 are three instrument attachment sections 36, 37 and 38. Each of attachment sections 36, 37, 38 are formed by attaching pile strips thereover. Pile strips 36, 37, 38 are stitched along all four sides thereof. A further layer 35A of nylon material is attached to main body 35 in selected areas on the back thereof, thus forming pockets 36A, 37A and 38A behind pile strips 36, 37, 38, respectively. Stiffening members 45, as illustrated in FIG. 4, are inserted in these pockets to provide support and a firm base for the electronic components placed thereon. The right-most end portion of main body 35 is provided with a Velcro loop strip 30 which coacts with pile strip 39 to serve as the initial securement means for forearm strap 20 in preparation for attaching quick-release buckles 24 and further adjustment and tightening of nylon straps 25.

Further, pockets 36A, 37A, 38A are clearly shown as formed by another layer 35A of nylon material which has been stitched over main body 35 in the areas of pile strips 36, 37, 38 to form these pockets for receiving stiffening support members 45. Stiffening support members 45 can be made of cardboard or rigid plastic material and once inserted into their respective pockets, serve to provide a smooth, flat pile surface for mating contact with an instrument that includes Velcro loops on its base surface to securely attach it thereto.

Referring now to FIG. 4 there is shown a sectional view taken along the plane 4—4 of FIG. 3. This figure provides a clear showing of pockets 36A, 37A and 38A which are formed by adding another layer of nylon material 35A in the areas of pile strips 36, 37, 38, respectively. Pockets 36A, 37A and 38A each receive a stiffening member 45 which is made of cardboard or rigid plastic material to provide a flat support surface at 36, 37 and 38 to allow for full engagement of the Velcro loops 30 to be attached thereto. After insertion of stiffening members 45, the open fourth side of each pocket is stitched to close the opening.

As can be seen from the above, applicant has developed a versatile forearm strap arrangement which allows portable equipment to be carried and readily available for use without the use of hands for holding the instrument. Although only a single instrument 26 is illustrated as being secured to the novel forearm strap, it is to be noted that that there are three pile strips 36, 37 and 38 thereon and as such, three instruments may be simultaneously carried thereon.

While the invention has been described in its preferred embodiment, it is to be understood that the words which have been used are words of description rather than words of limitation and that changes may be made within the purview of the appended claims without departing from the full scope or spirit of the invention.

Having thus described my invention, I claim:

1. A handsfree forearm strap for use with portable components;
said forearm strap comprising:
a base layer of fabric having an upper surface and a lower surface;
portable component attachment means and supporting means provided at predetermined locations relative to said upper surface of said base layer of fabric;
initial hook and loop attachment means located at opposite ends of said base layer of fabric;
secondary attachment means located inward of said initial attachment means for securely attaching said handsfree forearm strap to a user's forearm whereby a portable component having a strip of mating material secured to its base may be placed over said portable component attachment means and become securely attached thereto permitting the user free use of both hands to perform other tasks.

2. A handsfree forearm strap as defined in claim 1 wherein said portable component attachment means comprises loop pile which is attached to the upper surface of said base layer;
said loop pile having a length equal to said base layer and a width which covers at least the upper half of the user's forearm thus providing said attachment means for a plurality of portable components.

3. A handsfree forearm strap as defined in claim 1 wherein said portable component supporting means comprises a plurality of pockets which are attached to said lower surface of said base layer in alignment with said loop pile and stiffening means in said plurality of pockets for providing a smooth rigid support surface for the portable components secured thereto.

4. A handsfree forearm strap as defined in claim 3 wherein said stiffening means comprises strips of cardboard.

5. A handsfree forearm strap as defined in claim 3 wherein said stiffening means comprises a rigid plastic member.

6. A handsfree forearm strap as defined in claim 1 wherein said initial attachment means comprises a pair of cooperating hook and loop fastener members securely attached to ends of said base layer.

7. A handsfree forearm strap as defined in claim 6 wherein said pair of fastener members are secured to opposite ends of said base layer as well as opposite sides thereof.

8. A handsfree forearm strap as defined in claim 1 wherein said secondary attachment means are attached to said upper surface of said base layer.

9. A handsfree forearm strap as defined in claim 1 wherein said secondary attachment means comprises a plurality of quick disconnect coupling members and tightening straps for further tightening said handsfree forearm strap after said quick disconnect coupling members have been mated together whereby the handsfree forearm strap and the components thereon will be prevented from rotating relative to the user's forearm.

10. A handsfree forearm strap as defined in claim 1 wherein said portable component supporting means further includes pocket means secured to said upper surface of said base layer between said secondary attachment means for receiving a battery which provides electrical current to said portable components when attached thereto.

11. A handsfree forearm strap as defined in claim 1 wherein said base layer is a nylon fabric provided with a coating which increases the coefficient of friction on the lower surface thereof to resist rotation of said forearm strap relative to the user's forearm.

* * * * *